(12) United States Patent
Lehmann

(10) Patent No.: US 8,537,510 B2
(45) Date of Patent: Sep. 17, 2013

(54) METHOD AND APPARATUS FOR MONITORING THE ISOLATION OF AN IT-GRID

(75) Inventor: Reinhard Lehmann, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 13/234,586

(22) Filed: Sep. 16, 2011

(65) Prior Publication Data

US 2012/0014020 A1    Jan. 19, 2012

Related U.S. Application Data

(63) Continuation of application No. PCT/EP2010/053368, filed on Mar. 16, 2010.

(30) Foreign Application Priority Data

Mar. 16, 2009 (EP) ..................................... 09155278

(51) Int. Cl.
*H02H 3/00* (2006.01)
*H02H 9/08* (2006.01)

(52) U.S. Cl.
USPC ................... 361/42; 361/43; 361/44; 361/45; 361/46; 361/47; 361/48; 361/49

(58) Field of Classification Search
USPC .......................................................... 361/42
See application file for complete search history.

(56) References Cited

U.S. PATENT DOCUMENTS

| 5,990,685 A | 11/1999 | Nightall |
| 7,576,547 B2 | 8/2009 | Mueller |
| 2001/0004310 A1 | 6/2001 | Kono |
| 2002/0105765 A1* | 8/2002 | Kondo et al. ................... 361/42 |
| 2007/0285102 A1 | 12/2007 | Muller |
| 2009/0046492 A1 | 2/2009 | Zacharias et al. |
| 2010/0204844 A1 | 8/2010 | Rettger et al. |

FOREIGN PATENT DOCUMENTS

| DE | 10125910 A1 | 7/2002 |
| EP | 0833423 A2 | 4/1998 |
| EP | 1265076 A1 | 12/2002 |
| JP | 9285015 A | 10/1997 |

OTHER PUBLICATIONS

EP1265076; Van Tichelen Paul, Weyen Dominique, Safety Device for monitoring a DC bus insulaion; Fig. 1-3; Specificaiton.*
International Search Report Dated Apr. 16, 2010 for International Application No. PCT/EP2010/053368. 4 Pages.
Written Opinion of the International Searching Authority Dated Sep. 20, 2011. 6 Pages.

* cited by examiner

*Primary Examiner* — Dharti Patel
(74) *Attorney, Agent, or Firm* — Eschweiler & Associates, LLC

(57) ABSTRACT

For monitoring the isolation of an IT-grid with respect to ground, an inverter connecting a direct current side with an alternating current side of the IT-grid and a photovoltaic device on the direct current side of the IT-grid, at least one isolation resistance of the direct current side with respect to ground is monitored for falling below a resistance threshold value while the inverter is running, and additionally a leakage current via the inverter towards ground is monitored for exceeding a current threshold value.

16 Claims, 2 Drawing Sheets

US 8,537,510 B2

METHOD AND APPARATUS FOR MONITORING THE ISOLATION OF AN IT-GRID

REFERENCE TO RELATED APPLICATIONS

This application is a continuation of PCT application PCT/EP2010/053368 filed Mar. 16, 2010, that claims priority to European patent application 09155278.6, filed Mar. 16, 2009.

FIELD

The invention relates to a method for monitoring the isolation of an IT-Grid with respect to ground, as well as to a corresponding apparatus for monitoring the isolation of an IT-Grid with respect to ground.

BACKGROUND

An IT (French: Isolé Terre)-Grid does not comprise a zero or neutral conductor. Thus, an isolation failure occurring between one of the conductors and ground initially only results in grounding of this conductor. In an IT-Grid, which normally ends on the alternating current side of the inverter at a transformer for feeding the electric energy in, for example, a public or local alternating current grid having a reference to ground, high currents, however, result in case of a connection to ground of a conductor on the alternating current side. This particularly applies to inverters operated at a high frequency. These high currents result in danger to persons and equipment so that, in case of their occurrence, shutting down is due immediately.

A measurement arrangement for determining the isolation resistance of an arrangement comprising a photovoltaic device that is connected via an inverter to a single phase grid having a grounded neutral conductor is known from DE 10 2006 022 686 A1. The known measurement arrangement for determining the isolation resistance with respect to ground may thus only operate with the inverter being deactivated. The isolation resistance is measured by means, of reference resistors that are grounded at one of their ends and that are alternately connected to the two conductors coming from the photovoltaic device on the direct current side of the inverter, whereupon voltages dropping between the two conductors and ground are measured. Alternatively, the currents that flow upon alternately connecting the two conductors to ground may also be measured. In the known measurement arrangement, each individual measurement of a current or a voltage takes several seconds up to minutes, since at first a stable distribution of the electric charges over all capacitances active with respect to ground has to be reached.

A safety device for monitoring an isolation of a DC-voltage bus is known from EP 1 265 076 B1, which, besides other documents, is referenced as prior art in the introductional part of the description of DE 10 2006 022 686 A1. A photovoltaic device that is connected via an inverter and an isolating transformer to an alternating current grid is indicated as one possible application. Due to the isolating transformer the alternating current side of the transformer is also isolated with respect to ground so that monitoring the DC-voltage bus isolation may also happen while the inverter is running, since it does not connect to ground. Monitoring the DC-voltage bus isolation is based here also on the measurement of voltages that drop from the conductors on the direct current side of the inverter over reference resistors that are grounded at one of their ends.

A further monitoring of the isolation of an IT-Grid on the basis of voltage drops over reference resistors is known from EP 0 833 423 A2, in which no application in connection with a photovoltaic device connected to an inverter is described.

A product of the company Dipl.-Ing. W. Bender GmbH & Co. KG having the product designation IRDH 275 is known as a further apparatus. This known apparatus applies a defined voltage with respect to ground to one of the conductors on the direct current side of the inverter at a time and measures the resulting current, which still flows even when a stable distribution of the charges over all capacitances that are active with respect to ground has been reached. This current is a direct measure of the isolation resistance of the respective conductor with respect to ground. This measurement is done at each of the two conductors on the direct current side of the inverter. Additionally, the polarity with respect to ground is inverted between two consecutive measurements at the same conductor to assure the measurement result. Due to the capacitances with respect to ground, which have to be reloaded in case of each new measurement until a stable measurement value is reached, each measurement takes several seconds to minutes. Correspondingly an isolation fault may only be recognized very slowly with this known apparatus and with this known method. However, even small isolation faults at a high isolation resistance are recognized at high accuracy. In the known application of the apparatus of the company Bender, these isolation faults of the IT-grid are also determined on the alternating current side of the inverter as they have an effect via the inverter up to the direct current side of the inverter.

So called GFCIs or ground fault circuit interrupters, which are, according to their English designation "residual current protective device", also nominated as RCD, separate a monitored alternating current circuit from ground, when a certain differential current strength between the currents flowing off and flowing back is exceeded, which indicates a leakage current towards ground. For determining the differential current strength, the conductors of the monitored AC current circuit are collectively guided through a ring core. The resulting magnetization of the ring core is a result of the sum of the currents through the conductors added up with their correct signs. In case of a short circuit of a conductor of the alternating current circuit with respect to ground, a transient current difference results, which may be easily determined by an induction coil around the ring core and be transformed in a signal for breaking the monitored electrical circuit. The use of ground fold circuit interruptors for ground connection monitoring is generally not possible in an IT-grid (see, for example, http://de.wikipedia.org/wiki/Niederspannungsnetz, and there the text referring to IT-systems in the sub-section "Arten").

A method and an apparatus for detecting isolation faults of a photovoltaic device with respect to ground are known from US 2002/0105765 A1. For this purpose, a differential current between the input lines of an inverter, which feeds the electric energy from the photovoltaic device into an alternating current grid, is determined. Besides the fault current of interest in case of a connection to ground in the area of the photovoltaic device, the differential current comprises a ground current that occurs, due to the finite capacitances of the photovoltaic device with respect to ground, as a result of potential changes of the input lines with respect to the ground reference of the output lines of the inverter at the switching frequency of the inverter. These ground current components, that flow towards ground on the direct current side of the converter via the capacitances of the photovoltaic device even without occurrence of a fault, are removed from the differential current to singly obtain the fault current signal of actual interest. US 2002/0105765 A1 does not relate to any isolation faults of the output lines of the inverter on its alternating current side.

SUMMARY

The invention is directed towards a method and an apparatus for monitoring the isolation of an IT-grid, by which both small changes of the isolation resistance may reliably be detected on both sides of the inverter and particularly dangerous isolation faults on the alternating current side of the inverter may be identified quickly.

In one embodiment of the method, in addition to monitoring the isolation resistance of the direct current side, a leakage current via the running inverter towards ground is monitored. As the inverter galvanically connects its direct current side with its alternating current side, both types of monitoring also detect short circuits with respect to ground at the alternating current side and in the inverter. In that case the measurement of the leakage current very quickly responds to such short circuits so that danger for humans and equipment resulting therefrom may be encountered with the velocity required.

In one embodiment of the method, the leakage current via the running inverter towards ground is monitored for exceeding a current threshold value. A certain leakage current flowing via the inverter and via its alternating current side towards ground always occurs due to the capacitances between the alternating current side and ground and is no indication of an isolation fault. A strong increase of this leakage current, however, indicates an isolation fault. Such a strong increase may be detected easily by comparison of the monitored leakage current with a current threshold value. Here, as a rule, it is sufficient to look at non-stationary parts of the leakage current and monitor them for exceeding the current threshold value, because, as a rule, the strong increase of the leakage current via the inverter also occurs very quickly.

In case of the leakage current exceeding the current threshold value, the inverter is shut down immediately in one embodiment. At least a warning message is given, which may also happen in addition to shutting down. The same applies in the case of the isolation resistance of the direct current side, which is monitored while the inverter is running, is falling below the resistance threshold value.

In one embodiment the leakage current via the running inverter towards ground is monitored by monitoring the difference of the currents through the two conductors of the direct current side to the inverter, i.e., on the direct current side of the inverter. Thus, by means of monitoring the leakage current, the entire alternating current side of the inverter, and not just from a point of determination of the leakage current on the alternating current side, is covered concerning isolation faults with respect to ground.

Surprisingly, in the new method the leakage current may be monitored by simply monitoring the difference of the currents through the two conductors of the direct current side towards the inverter by, for example, measuring, by means of an induction coil, the magnetic field that is jointly induced by both conductors. Due to the inverter, which connects the conductors of the direct current side pulse by pulse with the shorted conductor of the alternating current side, a modulation of the difference of the currents through both conductors, which provokes a strong signal in the induction coil, results from the short circuit with respect to ground on the alternating current side. With this signal, the inverter may be shut down or the alternating current side of the inverter may be separated from the photovoltaic panel in another way.

In one embodiment of the method, the isolation resistance may be determined by any method that is described herein. However, in one embodiment the isolation resistance is monitored by comparison with reference resistors. In doing so, even small faults in the isolation resistance are observed. The duration of each individual measurement of some seconds up to minutes, however, is too long for quickly detecting dangerous short circuits with respect to ground on the alternating current side of the inverter. For this purpose, the leakage current is monitored.

In one embodiment the isolation resistances of the two conductors of the direct current side towards ground are monitored individually. Thus, it may be differentiated between isolation faults of the individual conductors on the direct current side and isolation faults on the alternating current side, which have an effect on the isolation resistance of both conductors on the direct current side. Monitoring of the leakage current via the inverter towards ground only gives an error signal for isolation faults on the alternating current side of the inverter. This also allows for allocation of faults to the direct current side or the alternating current side of the inverter.

For IT-grids two capacitances are connected in series between the two conductors of the direct current side, with the centre point of the series connection being grounded. This way an EMC-filter is formed and an additional protection against leakage currents is provided for the personnel that is servicing the running photovoltaic device.

In the apparatus according to the invention besides the resistance measurement device that determines the isolation resistance of the direct current side with respect to ground, a current measurement device is provided that determines a leakage current via the inverter towards ground on the direct current side. Since this leakage current in case of a short circuit to ground on the alternating current side of the inverter is a switching frequency alternating current, i.e., an alternating current at the switching frequency of the inverter, the current measurement device may have a ring core that encloses the conductors of the direct current side and which may be coiled of crystalline or nano-crystalline soft magnetic ribbon like in a usual residual current operated device. The magnetization of the ring core at the switching frequency may accordingly be measured in a common way by means of an induction coil.

In one embodiment the isolation measurement device of the new apparatus comprises at least one switch, at least one reference resistor grounded at one of its ends, and a measurement device for the voltage drop across the reference resistor. Generally, however, it is also possible that the resistance measurement device comprises a voltage source for a voltage with respect to ground or a constant current source for measuring the isolation resistance of the direct current side of the inverter, which is also affected by the isolation resistance of the alternating current side of the inverter in case the inverter is running.

Other further developments of the invention emerge from the claims, the description and the drawings. Advantages of features and of combinations of several features mentioned in the introductional part of the description are only exemplary and may come into effect alternatively or cumulatively, without the features necessarily being achieved by embodiments according to the invention. Further features may be taken from the drawings—particularly from the depicted geometries and the relative dimensions of several parts with regard to each other as well as from their relative arrangement and operational connection. The combination of features of different embodiments of the invention and of features of different patent claims is also possible deviating from the selected dependencies of the claims and is herewith motivated. This also relates to such features that are depicted in separate drawings or mentioned in their description. These features may also be combined with features of different claims. Similarly, features mentioned in the claims may also be omitted for further embodiments of the invention.

BRIEF DESCRIPTION OF THE DRAWINGS

In the following the invention will be further explained and described by means of specific exemplary embodiments with reference to the enclosed drawings.

DETAILED DESCRIPTION

Figure 1:
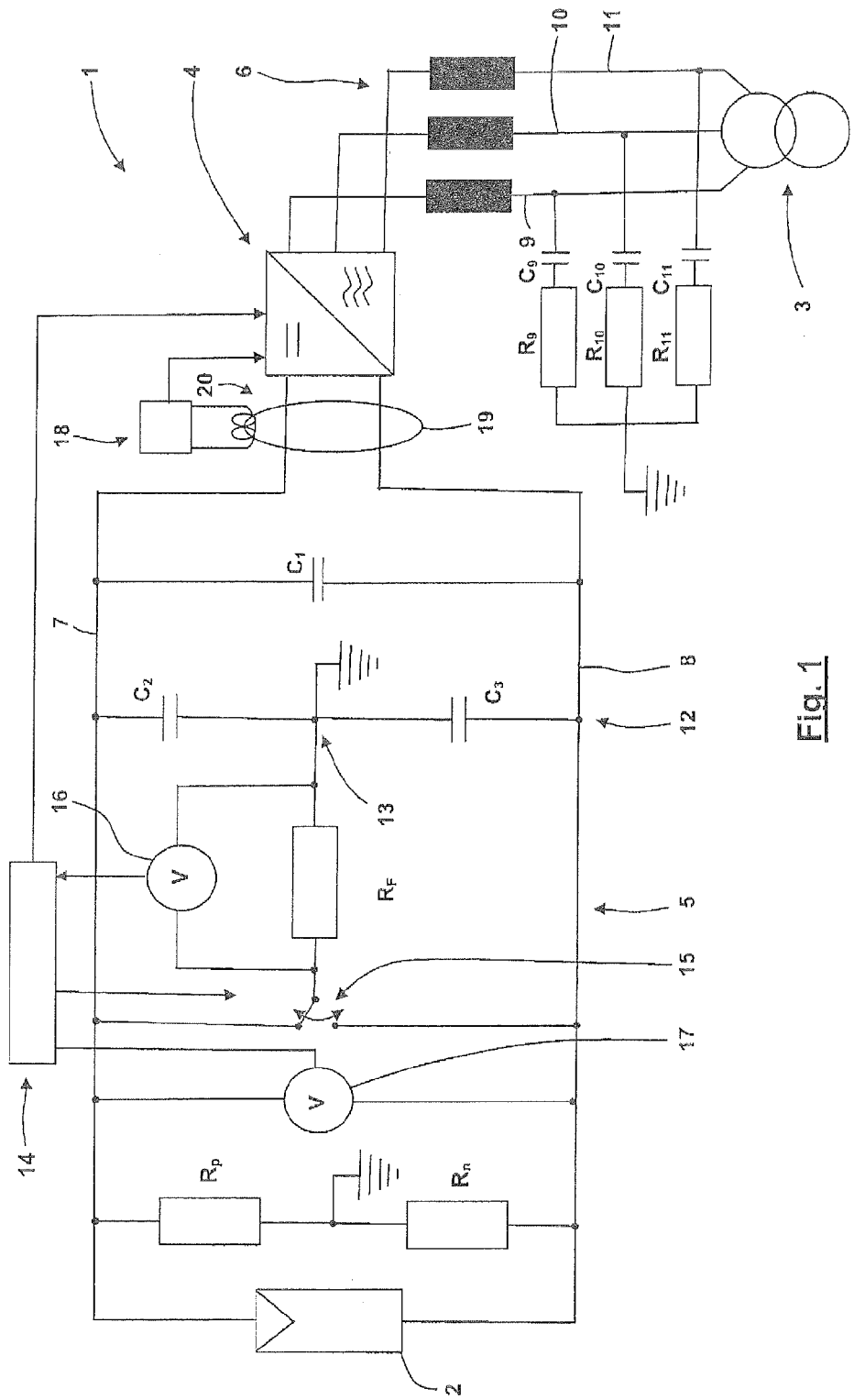
FIG. 1 shows a circuit diagram relating to an IT-grid with an inverter connecting a photovoltaic device to a transformer and with an apparatus for isolation monitoring according to the invention.

In FIG. 1, an IT-grid 1 is depicted that extends from a photovoltaic device 2 to a transformer 3 and by which the electric power of the photovoltaic device 2 is coupled in a grounded AC power grid. Here, an inverter 4, is provided, which converts the direct current coming from the photovoltaic device 2 into an alternating current. In this way, the inverter 4 connects a direct current side 5 of the IT-grid with an alternating current side 6. This connection is galvanically here. This means that the conductors 7 and 8 of the direct current side 5 are pulse by pulse directly connected to the conductors 9 to 11 of the alternating current side 6 such that a galvanic contact exists. Other requirements with regard to the inverter do not exist here. Thus, it may be constructed in various practical ways. In the IT-grid 1 designed without grounding, the isolation resistances $R_p$ of the plus conductor 7 and $R_p$ of the minus conductor 8 on the direct current side 5 with respect to ground have to be monitored in the same way as the isolation resistances $R_9$ to $R_{11}$ with respect to ground of the conductors 9 to 11 on the alternating current side 6. Here, additional isolation capacitances $C_9$ to $C_{11}$ with respect to ground are active on the alternating current side 6. Also on the direct current side 5 capacitances play a role, where the depicted capacitance $C_1$ both represents the capacitance of the photovoltaic device 2 and the capacitance of a possible buffer capacitor on the input side of the inverter 4, and the capacitances $C_2$ and $C_3$ both represent the line capacitances with respect to ground and an EMV-filter 12 with a grounded centre point 13. For measuring the isolation resistances a resistance measurement device 14 is provided that connects a reference resistor $R_F$ that is grounded at one of its ends alternately with the conductors 7 and 8 via a selector switch 15 and then, by means of a voltmeter 16, measures a voltage $U_{16}$ dropping across the resistor $R_F$. At the same time, the resistance measurement device 14 measures the voltage $U_{17}$ between the conductors 7 and 8 by means of a voltmeter 17. From the measurement values $U_{16-7}$ and $U_{16-8}$ of the voltmeter 16 and $U_{17-7}$ and $U_{17-8}$ of the voltmeter 7 with the resistor $R_F$ being connected to the conductor 7 and the conductor 8, respectively, the isolation resistances $R_p$ and $R_n$ result from:

$$R_p = R_F((U_{17-7} - U_{16-7})/U_{16-8} - 1)$$

$$R_n = R_F((U_{17-8} - U_{16-8})/U_{16-7} - 1)$$

When the inverter 4 is running, the values of $R_p$ and $R_n$ are each also influenced by components of $R_9$ to $R_{11}$. The values of $R_p$ and $R_n$ may only be measured by means of the voltages measured with the voltmeters 16 and 17 after some seconds to minutes when the charges of the capacitances $C_1$ to $C_3$ and $C_9$ and $C_{11}$ have been redistributed to such an extent that they are in a balanced condition. Correspondingly, changes of the isolation resistances are only recorded very slowly. They may, however, be determined at a high accuracy. The resistance measurement device 14 may thus also detect creeping and small but undesired faults of the isolation resistances and shut down the inverter 4 for avoiding resulting damages. The ratio of $R_p$ to $R_n$ further indicates, where an isolation fault occurs. An isolation fault on the alternating current side 6 affects $R_p$ and $R_n$ in a same way. An isolation fault on the direct current side 7 typically results at first in a decline of only one of the isolation resistances $R_p$ and $R_n$.

An additional current measurement device 18 measures a non-stationary leakage current on the direct current side 5 in that the conductors 7 and 8 are guided through a ring core 19 around which an induction coil 20 is arranged. A short circuit of one of the conductors 9 to 11 on the alternating current side 6 becomes noticeable via the inverter 4 by means of a non-stationary leakage current on the direct current side 5, which results in a non-stationary magnetization of the ring core 19 and thus in a signal at the induction coil 20. The signal may be monitored for exceeding a threshold value. As soon as this threshold value, which indicates a maximum allowable leakage current, is reached or exceeded, the current measurement device 18 shuts down the inverter 4. Certain leakage currents always occur due to the isolation capacitances $C_9$ to $C_{11}$ so that the threshold value for the leakage current may not be set to zero. In case of a short circuit of one of the conductors 9 to 11 on the alternating current side 6 with respect to ground, the leakage current however, quickly increases strongly. This results quickly in a signal at the induction coil 20, which may be used for also shutting down the inverter 4 very quickly. In that the ring core 19 encloses the conductors 7 and 8 in an actually unusual way on the direct current side 5, any leakage currents downstream of this measurement position are measured by the current measurement device 18 and not only from a certain point on the alternating current side 6 on.

Figure 2:
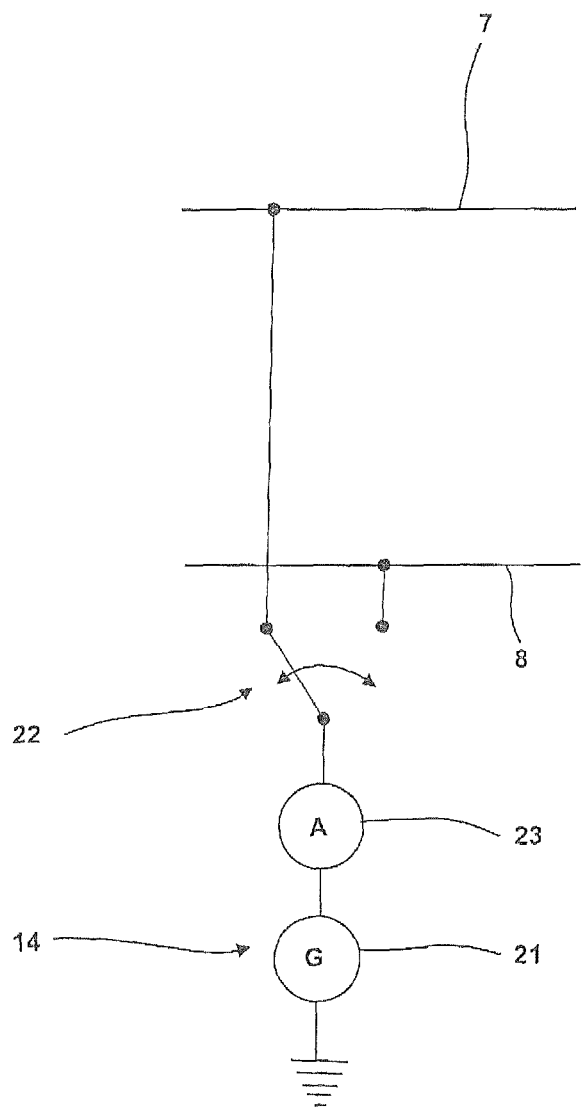
FIG. 2 shows an alternative to the resistance measurement device of the apparatus for isolation monitoring according to FIG. 1.

FIG. 2 illustrates an alternative embodiment of the resistance measurement device 14. This embodiment here includes a DC voltage source 21 with respect to ground that is alternately connectable to the conductors 7 and 8. Then the current flowing towards ground is measured by an amperemeter 23. The isolation resistance of the respective conductor 7 and 8, respectively, directly results from the output voltage of the DC-voltage source 21 and the current. Here, the polarity of the DC voltage source 21 may be inverted for two measurements of the isolation resistance of the same conductor to increase the measurement accuracy. FIG. 2 only depicts the details relevant for the alternative embodiment of the current measurement device 14. Apart from that the entire assembly may correspond to FIG. 1.

The invention claimed is:

1. A method for monitoring the isolation of an IT-grid with respect to ground, comprising an inverter connecting a direct current side with an alternating current side of the IT-grid, configured to couple to a photovoltaic device on the DC side of the IT-grid, comprising:

monitoring at least one isolation resistance of the direct current side with respect to ground when the inverter is in operation to ensure the at least one isolation resistance does not fall below a resistance threshold value while the inverter is running; and monitoring a leakage current passing through the inverter towards ground associated with the inverter in operation on a direct current side of the inverter to ensure the leakage current does not exceed a current threshold value.

2. The method for isolation monitoring according to claim 1, wherein monitoring the leakage current comprises monitoring non-stationary parts of the leakage current to ensure the non-stationary leakage current does not exceed the current threshold value.

3. The method for isolation monitoring according to claim 1, further comprising shutting down the inverter and/or providing a warning message or signal upon falling below the resistance threshold value and upon exceeding the current threshold value.

4. The method for isolation monitoring according to claim 1, wherein monitoring the leakage current comprises monitoring a difference of the current through two conductors of the direct current side of the IT-grid towards the inverter.

5. The method for isolation monitoring according to claim 4, wherein the current difference is monitored inductively.

6. The method for isolation monitoring according to claim 1, wherein the at least one isolation resistance is monitored by comparing the at least one isolation resistance to a reference resistance.

7. The method for isolation monitoring according to claim 1, wherein the at least one isolation resistance comprises isolation resistances of two conductors of the direct current side towards ground, and wherein the isolation resistances are monitored separately.

8. The method for isolation monitoring according to claim 1, wherein two capacitances are connected in series between two conductors on the direct current side of the inverter, with a center point of the series connection being grounded.

9. An apparatus for monitoring the isolation of an IT-grid with respect to ground, comprising:
an inverter that galvanically connects a direct current side of the IT-grid with an alternating current side of the IT-grid, and configured to be coupled to a photovoltaic device on the direct current side of the IT-grid;
a resistance measurement device configured to measure at least one isolation resistance of the direct current side with respect to ground when the inverter is in operation, compare the isolation resistance with a resistance threshold value, and provide a signal when it falls below the resistance threshold value; and
a current measurement device configured to measure a leakage current passing through the inverter towards ground on a direct current side of the inverter, compare the leakage current with a current threshold value, and provide a signal when it falls below the current threshold value.

10. The apparatus according to claim 9, wherein both the resistance measurement device and the current measurement device are configured to shut down the inverter and/or trigger an output of a warning message by their provided signals.

11. The apparatus according to claim 9, wherein the current measurement device is configured to measure the leakage current by measuring a difference between the currents through two conductors on the direct current side towards the inverter.

12. The apparatus according to claim 11, wherein the current measurement device comprises a ring core enclosing the two conductors on the direct current side.

13. The apparatus according to claim 9, further comprising two capacitances of an EMC-filter connected in series between two conductors on the direct current side, with a center point of the series connection being grounded.

14. An apparatus for monitoring the isolation of an IT-grid with respect to ground, comprising:
an inverter that galvanically connects a direct current side of the IT-grid with an alternating current side of the IT-grid, and configured to be coupled to a photovoltaic device on the direct current side of the IT-grid;
a resistance measurement device configured to measure at least one isolation resistance of the direct current side with respect to ground when the inverter is in operation, compare the isolation resistance with a resistance threshold value, and provide a signal when it falls below the resistance threshold value; and
a current measurement device configured to measure a leakage current of the inverter towards ground, compare the leakage current with a current threshold value, and provide a signal when it falls below the current threshold value, wherein the resistance measurement device comprises:
a reference resistor that is grounded at one of its ends;
a switch configured to selectively couple one of two conductors on the direct current side to a node of the reference resistor opposite the grounded end; and
a measurement device configured to measure a voltage drop across the reference resistor.

15. The apparatus according to claim 14, wherein the resistance measurement device is configured to individually connect the two conductors on the direct current side to the reference resistor via the switch.

16. A monitoring device for an inverter, comprising:
a leakage current measurement device configured to detect a change in leakage current on a direct current side of an inverter or passing through the inverter when the inverter is in operation, and generate an indication when the change in leakage current exceeds a threshold value, wherein the leakage current measurement device comprises:
a ring core associated with two DC input terminals of the inverter; and
an induction coil associated with the ring core,
wherein a change in leakage current associated with the inverter results in a change in magnetization of the ring core, and wherein the change in magnetization induces a signal in the induction coil,
wherein the leakage current measurement device further comprises a comparator configured to compare the signal from the induction coil to a threshold value and output a trigger signal corresponding to the indication if the induction coil signal exceeds the threshold value;
a resistance measurement device configured to measure an isolation resistance associated with a DC input side of an inverter to ground, and generate another indication when the isolation resistance falls below a resistance threshold value, wherein the resistance measurement device comprises:
a reference resistance having a first terminal configured to be selectively coupled to one of two input conductors on the DC input side of the inverter, and a second terminal coupled to ground;
a voltage detector coupled across the reference resistance, and configured to detect a voltage across the reference resistance associated with a current therethrough; and
a comparator configured to compare the voltage from the voltage detector to the resistance threshold value, and output a trigger corresponding to the another indication when the voltage falls below the resistance threshold value.

* * * * *